(12) United States Patent
Sakaguchi et al.

(10) Patent No.: US 6,911,762 B2
(45) Date of Patent: Jun. 28, 2005

(54) SURFACE ACOUSTIC WAVE ELEMENT, SURFACE ACOUSTIC WAVE DEVICE USING THE SAME, AND METHOD FOR MANUFACTURING SURFACE ACOUSTIC WAVE ELEMENT AND SURFACE ACOUSTIC WAVE DEVICE

(75) Inventors: Kenji Sakaguchi, Komatsu (JP); Masanobu Watanabe, Kanazawa (JP); Mitsushi Takatori, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 286 days.

(21) Appl. No.: 10/205,986

(22) Filed: Jul. 26, 2002

(65) Prior Publication Data

US 2003/0020376 A1 Jan. 30, 2003

(30) Foreign Application Priority Data

Jul. 26, 2001 (JP) .................................... 2001-225619
May 22, 2002 (JP) .................................... 2002-147816

(51) Int. Cl.$^7$ ............................................. H01L 41/08
(52) U.S. Cl. ................................. 310/313 R; 310/344
(58) Field of Search ........................... 310/313 R, 344, 310/348

(56) References Cited

U.S. PATENT DOCUMENTS

| 5,201,926 | A | | 4/1993 | Szczyrbowski et al. |
| 6,369,490 | B1 | * | 4/2002 | Taga .......................... 310/364 |
| 6,404,110 | B1 | * | 6/2002 | Nakashima et al. ........ 310/364 |
| 6,552,475 | B2 | * | 4/2003 | Hori et al. .................. 310/364 |

FOREIGN PATENT DOCUMENTS

| DE | 38 25 671 A1 | 3/1989 |
| EP | 1 049 253 A2 | 11/2000 |

\* cited by examiner

*Primary Examiner*—Mark Budd
(74) *Attorney, Agent, or Firm*—Keating & Bennett, LLP (57) ABSTRACT

A surface acoustic wave device includes a surface acoustic wave element, a packaging case, and a packaging electrode. The surface acoustic wave element has a piezoelectric substrate, an interdigital transducer, an electrode pad, an intermediate electrode, an upper electrode, and a bump electrode. The intermediate electrode is preferably made of NiCr including about 15 to about 30 weight percent of Cr. The electrode pad and upper electrode are made of Al. The bump electrode is press-bonded to the packaging electrode with an ultrasonic wave or heat applied to the bump electrode. The resulting surface acoustic wave device has excellent characteristics and the surface acoustic wave element is not removed or peeled from the packaging case during a drop test.

10 Claims, 8 Drawing Sheets

SURFACE ACOUSTIC WAVE ELEMENT, SURFACE ACOUSTIC WAVE DEVICE USING THE SAME, AND METHOD FOR MANUFACTURING SURFACE ACOUSTIC WAVE ELEMENT AND SURFACE ACOUSTIC WAVE DEVICE

BACKGROUND OF THE INVENTION

1. Field of the Invention

The present invention relates to a region where bump electrodes of a surface acoustic wave element are provided, and more particularly, to a surface acoustic wave element having bump electrodes for facilitating the mounting of the surface acoustic wave element which is performed using an ultrasonic wave applied thereto, to a surface acoustic wave device including such a surface acoustic wave element, and a method for manufacturing the surface acoustic wave element and the surface acoustic wave device.

2. Description of the Related Art

Electronic components have recently been miniaturized and made to be very low-profile. As a result, face-down mounting methods have been developed in which a surface acoustic wave element is directly mounted on a substrate such that the functional surface of the surface acoustic wave element opposes the mounting surface of the substrate. In face-down mounting methods, electrode pads of the surface acoustic wave element are connected to a packaging electrode of a packaging case via the bump electrodes.

Figure 8:
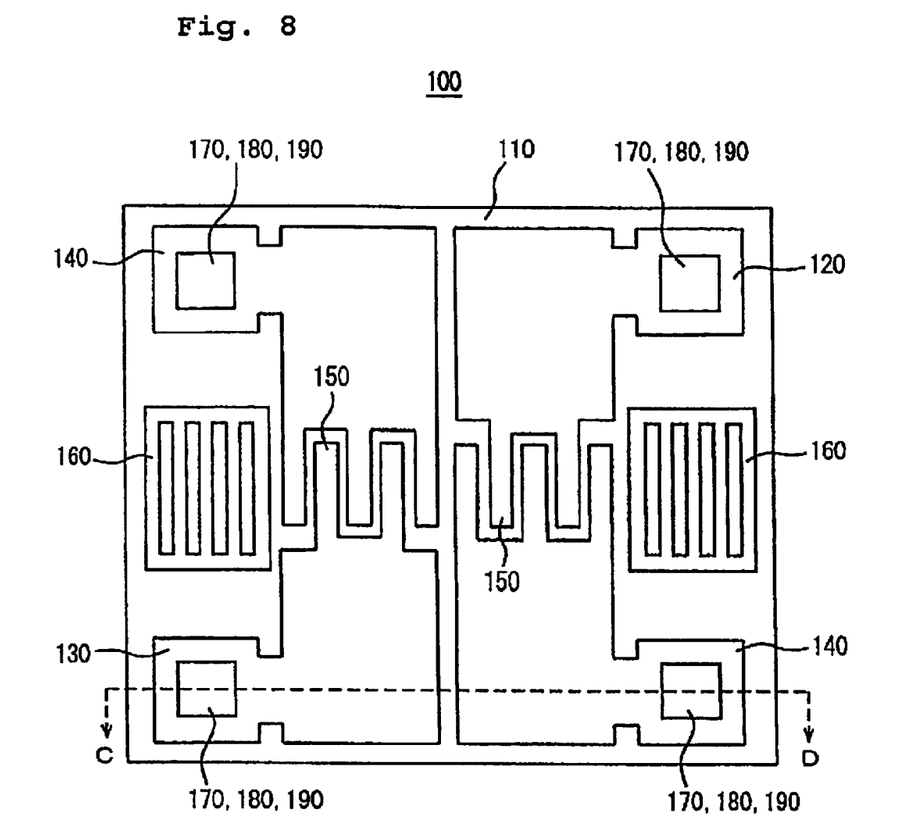
FIG. 8 is a plan view of a known surface acoustic wave element.

FIG. 8 shows a known surface acoustic wave element 100. The known surface acoustic wave element 100 has a piezoelectric substrate 110, an input electrode 120, an output electrode 130, grounding electrodes 140, an interdigital transducer 150, reflector electrodes 160, base electrodes 170, intermediate electrodes 180, and bump electrodes 190.

The piezoelectric substrate 110 is made of lithium tantalate. The input electrode 120, the output electrode 130, the grounding electrodes 140, the interdigital transducer 150, and the reflector electrodes 160 are made of a metallic layer having a thickness of 100 nm to 200 nm mainly containing aluminium (Al). The input electrode 120, the output electrode 130, the grounding electrodes 140, the interdigital transducer 150, and the reflector electrodes 160 are simultaneously formed on the same surface of the piezoelectric substrate 110, and thus, they have the same thickness. The input electrode 120, the output electrode 130, and the grounding electrodes 140 also define electrode pads for supplying high frequency voltage to the interdigital transducer 150.

Figure 9:
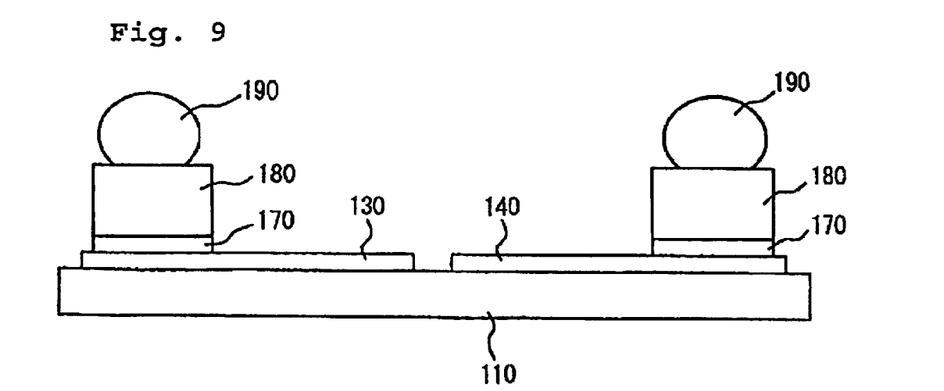
FIG. 9 is a sectional view taken along line C-D in FIG. 8.

The base electrodes 170, the intermediate electrodes 180, and the bump electrodes 190 are disposed on the input electrode 120, the output electrode 130, and the grounding electrodes 140. The structure in a sectional view of a region where the base electrodes 170, the intermediate electrodes 180, and the bump electrodes 190 are located will now be described. FIG. 9 is a sectional view taken along line C-D in FIG. 8. In FIG. 9, the base electrodes 170, the intermediate electrodes 180, and the bump electrodes 190 are disposed, in that order, on the output electrode 130 and the grounding electrode 140. The base electrodes 170 are made of NiCr and have a thickness of about 200 nm. The intermediate electrodes 180 are made of Al and have a thickness of about 1000 nm. The bump electrodes 190 are made of Au.

Figure 10:
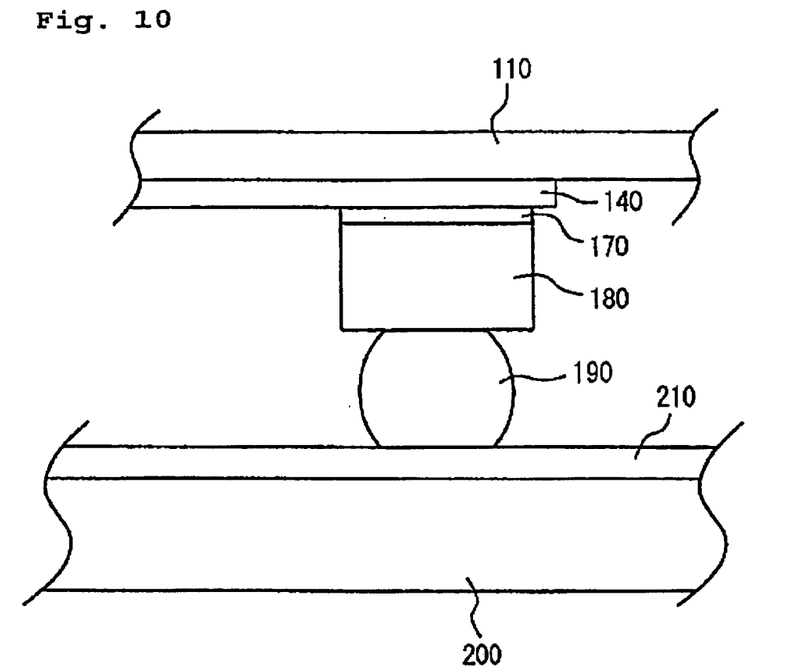
FIG. 10 is a fragmentary enlarged sectional view of a bump electrode in FIG. 9.

The surface acoustic wave element 100, which has the interdigital transducer 150 disposed on a main surface of the piezoelectric substrate 110, is connected to packaging electrodes of a packaging case such that the functional surface thereof faces downward. Specifically, in order to mount the surface acoustic wave element 100, an ultrasonic wave is applied to the bump electrodes 190 to be connected to a packaging electrode 210 of a ceramic packaging case 200, as shown in FIG. 10.

When the surface acoustic wave element 100 is mounted in the packaging case 200, the input electrode 120, the output electrode 130, and the grounding electrodes 140, which define electrode pads, may be directly connected to the packaging electrode 210 using the bump electrodes 190. In this instance, however, the thickness of the input electrode 120, the output electrode 130, and the grounding electrodes 140 is in the range of about 100 nm to 500 nm and is too small to ensure the adhesion between the electrode pads and the packaging electrode 210, and therefore the electrode pads are liable to peel.

Accordingly, in the known surface acoustic wave element 100, the input electrode 120, the output electrode 130, and the grounding electrodes 140 partially include the intermediate electrodes 180 with a thickness of about 1000 nm to ensure the adhesion between the electrode pads and the packaging electrode 210.

Also, if the intermediate electrodes 180 are directly disposed on the electrode pads, such as the input electrode 120, the intermediate electrodes 180 are disposed on the Al surface which defines the electrode pads and which has been oxidized. Therefore, the adhesion between the electrode pads and the intermediate electrodes 180 is not ensured. Accordingly, the base electrodes 170 that are capable of adhering to the Al electrode pads and intermediate electrodes 180 are disposed between the electrode pads and the intermediate electrodes 180. The base electrodes 170 are made of NiCr. Ti, which is also capable of adhering to Al, may be used for the base electrodes 170. Unfortunately, Ti base electrodes cause cracks to occur in the piezoelectric substrate 110 when an ultrasonic wave is applied to the bump electrodes 190 for connecting the electrode pads to the packaging electrode 210. Therefore, in order to prevent the cracks from occurring in the piezoelectric substrate 110, the base electrodes 170 are made of NiCr.

However, the known surface acoustic wave element 100 is liable to peel from the packaging case 200 at a certain probability during a drop test in which the surface acoustic wave element 100 is dropped from a height of 1 m to 1.5 m. The peeling occurs between the electrode pads, such as the input electrode 120 and the base electrodes 170.

Also, the base electrodes 170 and the intermediate electrodes 180 are formed on the electrode pads by lift off in which the region where the base electrode 170 and the intermediate electrode 180 are not to be formed is covered with a resist defining a mask which is supposed to be removed after the formation of the base electrodes 170 and the intermediate electrodes 180. In this instance, since the NiCr forming the base electrodes 170 has a high tensile stress, the Al forming the intermediate electrodes 180 is deposited on the interdigital transducer 150 as well as on the electrode pads.

Figure 11:
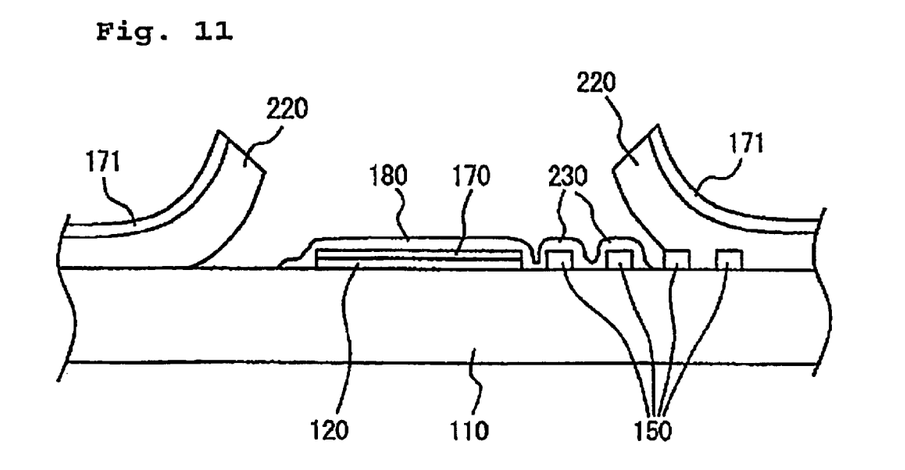
FIG. 11 is a fragmentary sectional view of the known surface acoustic wave element, showing a problem in a process used for manufacturing the surface acoustic wave element.

Specifically, when NiCr is deposited on the electrode pads to form the base electrodes 170, as shown in FIG. 11, a NiCr layer 171 is formed on the resist 220. The high tensile stress of the NiCr layer 171 allows the ends of the resist 220 to recurve, and thus, a portion of the interdigital transducer 150 is exposed. As a result, when the intermediate electrodes 180 are subsequently formed, an Al layer 230 is formed not only on the electrode pads but also on a portion of the interdigital transducer 150. Thus, the surface acoustic wave element 100 is damaged.

SUMMARY OF THE INVENTION

Accordingly, in order to overcome the problems described above, preferred embodiments of the present invention provide a surface acoustic wave device and a surface acoustic wave element, and a method of manufacturing both, wherein the surface acoustic wave element and device have excellent characteristics and do not peel from the packaging case during a drop test.

According to a preferred embodiment of the present invention, a surface acoustic wave element includes a piezoelectric substrate, an interdigital transducer disposed on a main surface of the piezoelectric substrate, an electrode pad disposed on the main surface of the piezoelectric substrate, an intermediate electrode disposed on the electrode pad, an upper electrode disposed on the intermediate electrode, and a bump electrode disposed on the upper electrode. The intermediate electrode is preferably a thin metal layer having a tensile stress that is lower than a predetermined value and an adhesion strength to one of the electrode pad and the upper electrode that is higher than a predetermined value.

By disposing, between the electrode pad and the upper electrode, the intermediate electrode having a tensile stress that is lower than a predetermined value and an adhesion strength to one of the electrode pad and the upper electrode that is higher than a predetermined value, the deposition of the material of the upper electrode on the interdigital transducer is prevented even though the intermediate electrode and the upper electrode are formed together on the electrode pad by lift off. Also, peeling does not occur between the intermediate electrode and the electrode pad or upper electrode during a drop test of the surface acoustic wave element.

Preferably, the intermediate electrode includes NiCr containing about 15 to about 30 weight percent of Cr.

Using the NiCr containing about 15 weight percent or less of Cr to form the intermediate electrode, a surface acoustic wave element can be achieved in which peeling does not occur between the intermediate electrode and the electrode pad or upper electrode. By using the NiCr containing about 30 weight percent or less of Cr to form the intermediate electrode, a surface acoustic wave element can be achieved in which the deposition of the material of the upper electrode on the interdigital transducer does not occur while the intermediate electrode and the upper electrode are successively formed. Therefore, by using the NiCr containing about 15 to about 30 weight percent of Cr to form the intermediate electrode, the resulting surface acoustic wave element does not experience peeling between the intermediate electrode and the electrode pad or upper electrode, or the deposition of the material of the upper electrode on the interdigital transducer.

Preferably, the intermediate electrode includes NiCr containing about 18 to about 28 weight percent of Cr.

By setting the Cr content in the intermediate electrode in the preferred range of about 18 to about 28 weight percent, the deposition of the material of the upper electrode on the interdigital transducer can be further prevented. Also, the peeling of the surface acoustic wave element from a packaging case during a drop test can be further prevented.

Preferably, the NiCr is deposited by evaporation.

By depositing the NiCr by evaporation to form the intermediate electrode, the adhesion of the intermediate electrode to the electrode pad and the upper electrode can be greatly improved.

Preferably, the upper electrode includes Al or an alloy containing Al.

As a result, the adhesion between the intermediate electrode and the upper electrode is even more improved in the surface acoustic wave element.

According to another preferred embodiment of the present invention, a surface acoustic wave device includes a packaging case having a packaging electrode, a cover for hermetically sealing the packaging case, and a surface acoustic wave element. The surface acoustic wave element includes a piezoelectric substrate, an interdigital transducer disposed on a main surface of the piezoelectric substrate, an electrode pad disposed on the main surface of the piezoelectric substrate, an intermediate electrode disposed on the electrode pad, an upper electrode disposed on the intermediate electrode, and a bump electrode disposed on the upper electrode and connected to the packaging electrode. The intermediate electrode is a thin metal layer having a tensile stress that is lower than a predetermined value and an adhesion strength to one of the electrode pad and the upper electrode that is higher than a predetermined value.

By using the surface acoustic wave element having the intermediate electrode including a metal layer having a tensile stress that is lower than a predetermined value and an adhesion strength to one of the electrode pad and the upper electrode that is higher than a predetermined value, a surface acoustic wave device can be achieved which does not experience characteristic failure or peeling of the surface acoustic wave element from the packaging case during a drop test.

Preferably, the intermediate electrode includes NiCr containing about 15 to about 30 weight percent of Cr.

By using the NiCr containing about 15 to about 30 weight percent of Cr to form the intermediate electrode, the resulting surface acoustic wave element does not experience peeling between the intermediate electrode and the electrode pad or upper electrode or deposition of the material of the upper electrode on the interdigital transducer. By using this surface acoustic wave element for the surface acoustic wave device, the resulting surface acoustic wave device does not experience characteristic failure or peeling of the surface acoustic wave element from the packaging case during a drop test.

Preferably, the intermediate electrode includes NiCr containing about 18 to about 28 weight percent of Cr.

The surface acoustic wave element of the surface acoustic wave device does not peel during a drop test, and therefore, the characteristics of the surface acoustic wave device are maintained.

Preferably, the NiCr is deposited by evaporation.

By depositing the NiCr by evaporation to form the intermediate electrode, the deposition of the material of the upper electrode on the interdigital transducer can be further prevented. Also, peeling of the surface acoustic wave element from the packaging case during a drop test can be further prevented.

Preferably, the upper electrode includes Al or an alloy containing Al.

As a result, the peeling of the surface acoustic wave element from the packaging case is still further prevented.

According to another preferred embodiment of the present invention, a method for manufacturing a surface acoustic wave element includes the steps of patterning an interdigital transducer and an electrode pad on a main surface of a piezoelectric substrate, applying a resist to cover the electrode pad except a portion thereof and the interdigital transducer, forming an intermediate electrode of a thin metal layer on the portion of the electrode pad using the resist as a mask, forming an upper electrode on the intermediate electrode using the resist as a mask, removing the resist, and forming a bump electrode on the upper electrode. The thin metal layer having a tensile stress that is lower than a predetermined value and an adhesion strength to one of the electrode pad and the upper electrode that is higher than a predetermined value is formed as the intermediate electrode in the step of forming the intermediate electrode.

By forming the intermediate electrode of a metal layer having a tensile stress that is lower than a predetermined value and an adhesion strength to one of the electrode pad and the upper electrode that is higher than a predetermined value, the recurving of the resist can be prevented, and consequently the deposition of the material of the upper electrode on the interdigital transducer can be prevented. Also, the peeling between the intermediate electrode and the electrode pad or upper electrode does not occur during a drop test of the surface acoustic wave element.

Preferably, the intermediate electrode includes NiCr containing about 15 to about 30 weight percent of Cr.

NiCr containing about 30 weight percent or less of Cr results in an intermediate electrode having a tensile stress that is lower than a predetermined value. Also, NiCr containing at least about 15 weight percent or more of Cr results in an intermediate electrode having an adhesion strength to the electrode pad and the upper electrode that is higher than a predetermined value. Therefore, by using the NiCr containing about 15 to about 30 weight percent of Cr to form the intermediate electrode, the resulting surface acoustic wave element does not experience peeling between the intermediate electrode and the electrode pad or upper electrode, or the deposition of the material of the upper electrode on the interdigital transducer.

Preferably, the intermediate electrode includes NiCr containing about 18 to about 28 weight percent of Cr.

As a result, the deposition of the material of the upper electrode on the interdigital transducer is further prevented. Also, the adhesion between the intermediate electrode and the upper electrode is even more improved.

Preferably, the NiCr is deposited by evaporation.

By depositing the NiCr by evaporation to form the intermediate electrode, the deposition of the material of the upper electrode on the interdigital transducer can be further prevented when the intermediate electrode and the upper electrode are successively formed. Also, the adhesion between the intermediate electrode and the electrode pad and upper electrode can be even more improved.

According to another preferred embodiment of the present invention, a method for manufacturing a surface acoustic wave device is includes the steps of patterning an interdigital transducer and an electrode pad on a main surface of a piezoelectric substrate, applying a resist to cover the electrode pad except a portion thereof and the interdigital transducer, forming an intermediate electrode of a thin metal layer on the portion of the electrode pad using the resist as a mask, forming an upper electrode on the intermediate electrode using the resist as a mask, removing the resist, forming a bump electrode on the upper electrode, and pressing the bump electrode to a packaging electrode of a packaging case while applying an ultrasonic wave or heat such that the bump electrode is bonded to the packaging electrode. The thin metal layer having a tensile stress that is lower than a predetermined value and an adhesion strength to one of the electrode pad and the upper electrode that is higher than a predetermined value is formed as the intermediate electrode in the step of forming the intermediate electrode.

By using, for the surface acoustic wave element, the intermediate electrode formed of a thin metal layer having a tensile stress that is lower than a predetermined value and an adhesion strength to one of the electrode pad and the upper electrode that is higher than a predetermined value, the recurving of the resist can be prevented. Consequently, the deposition of the material of the upper electrode on the interdigital transducer can be prevented. Also, the peeling of the surface acoustic wave element from the packaging case during a drop test of the surface acoustic wave device can be prevented.

Preferably, the intermediate electrode includes NiCr containing about 15 to about 30 weight percent of Cr.

NiCr containing about 30 weight percent or less of Cr results in an intermediate electrode having a tensile stress that is lower than a predetermined value. Also, NiCr containing at least about 15 weight percent or more of Cr results in an intermediate electrode having an adhesion strength to the electrode pad and the upper electrode that is higher than a predetermined value. Therefore, by using the intermediate electrode formed of NiCr containing about 15 to about 30 weight percent of Cr for the surface acoustic wave element, a surface acoustic wave device can be achieved which does not experience characteristic failure or peeling of the surface acoustic wave element from the packaging case.

Preferably, the intermediate electrode includes NiCr containing about 18 to about 28 weight percent of Cr.

The deposition of the material of the upper electrode on the interdigital transducer is further prevented. Also, the peeling of the surface acoustic wave element from the packaging case during a drop test of the surface acoustic wave device is further prevented.

Preferably, the NiCr is deposited by evaporation.

By depositing the NiCr by evaporation to form the intermediate electrode, the deposition of the material of the upper electrode on the interdigital transducer can be further prevented. Also, peeling of the surface acoustic wave element from the packaging case during a drop test of the surface acoustic wave device can be further prevented.

Other features, elements, characteristics and advantages of the present invention will be more apparent from the following detailed description of preferred embodiments with reference to the attached drawings.

DETAILED DESCRIPTION OF PREFERRED EMBODIMENTS

Preferred embodiments of the present invention will now be described with reference to the drawings. The same elements in the drawings are designated by the same numerals and the description is not repeated.

Figure 1:
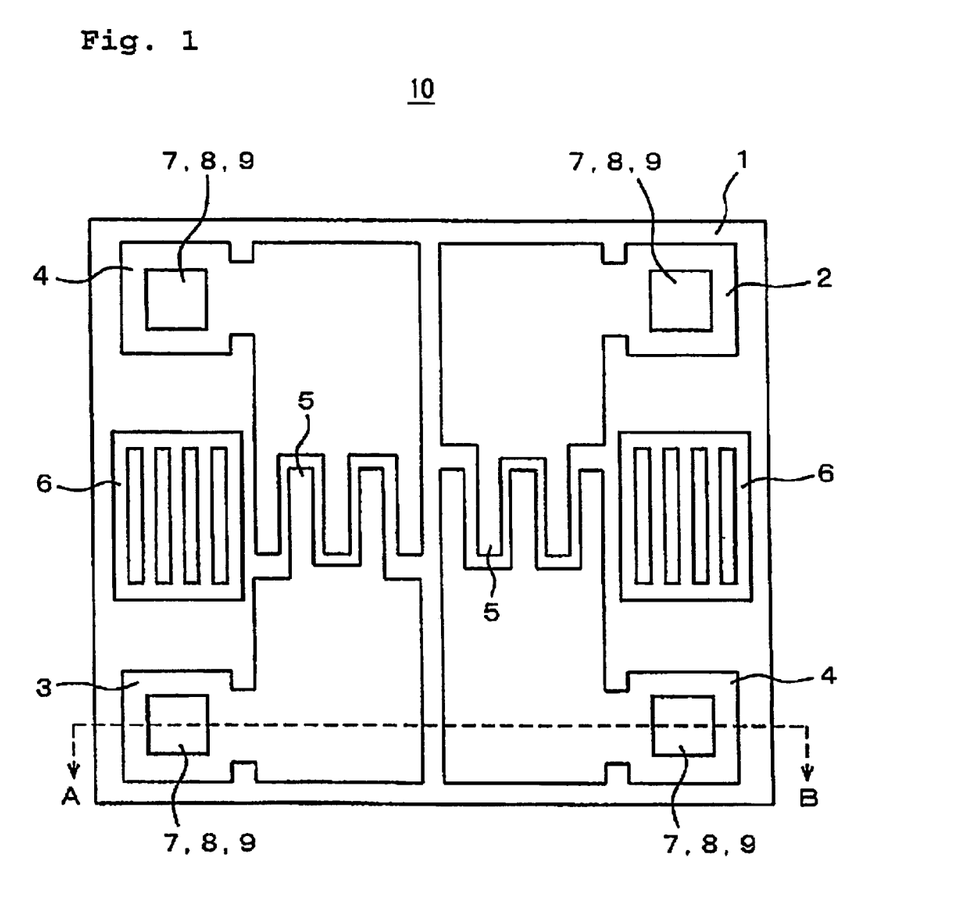
FIG. 1 is a plan view of a surface acoustic wave element according to a preferred embodiment of the present invention.

FIG. 1 shows a surface acoustic wave element 10. The surface acoustic wave element 10 preferably includes a piezoelectric substrate 1, an input electrode 2, an output electrode 3, grounding electrodes 4, an interdigital transducer 5, reflector electrodes 6, intermediate electrodes 7, upper electrodes 8, and bump electrodes 9.

The piezoelectric substrate 1 is preferably made of lithium tantalate. The input electrode 2, the output electrode 3, the grounding electrodes 4, the interdigital transducer 5, and the reflector electrodes 6 are preferably made of an Al layer having a thickness of about 100 nm to about 400 nm. The interdigital transducer 5 and the reflector electrodes 6 are functional elements for allowing the surface acoustic wave element 10 to function. The input electrode 2, the output electrode 3, and the grounding electrodes 4 double as electrode pads for supplying high frequency voltage to the interdigital transducer 5 and for electrically and physically connecting the surface acoustic wave element 10 to a packaging case. The input electrode 2, the output electrode 3, the grounding electrodes 4, the interdigital transducer 5, and the reflector electrodes 6 are simultaneously formed on a main surface of the piezoelectric substrate 1 by vacuum deposition or sputtering, and are subsequently patterned in a plane by photolithography or etching, as shown in FIG. 1. Thus, the input electrode 2, the output electrode 3, the grounding electrodes 4, the interdigital transducer 5, and the reflector electrodes 6 preferably have substantially the same thickness.

Figure 2:
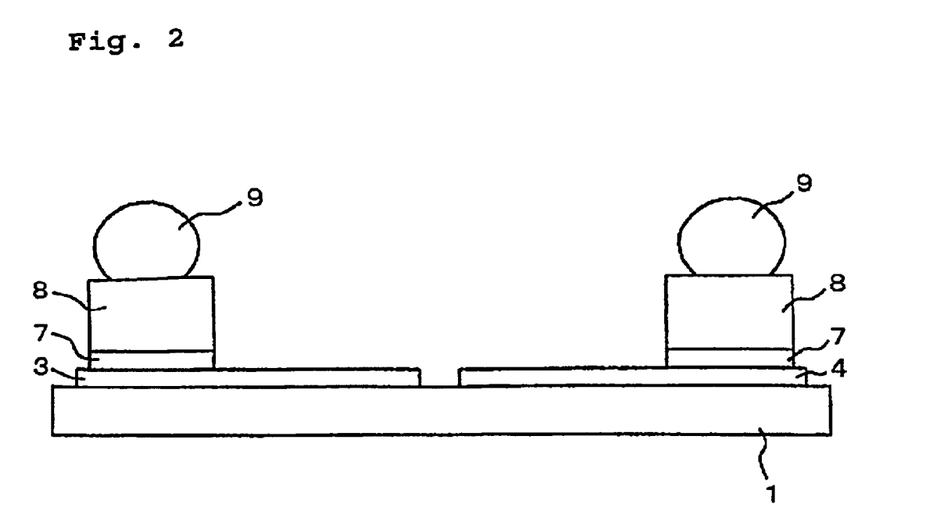
FIG. 2 is a sectional view taken along line A-B in FIG. 1.

The intermediate electrodes 7, the upper electrodes 8, and the bump electrodes 9 are disposed on a portion of the input electrode 2, the output electrode 3, and the grounding electrodes 4. FIG. 2 is a sectional view taken along line A-B in FIG. 1. In FIG. 2, the output electrode 3 and one of the grounding electrodes 4 are disposed on a main surface of the piezoelectric substrate 1, and the intermediate electrodes 7 are disposed on a portion of the output electrode 3 and the grounding electrode 4. The upper electrodes 8 are disposed on the intermediate electrodes 7, and the bump electrodes 9 are disposed on the upper electrodes 8.

The intermediate electrodes 7 preferably have a thickness of about 200 nm and are made of NiCr having a Cr content in the range of about 15 to about 35 weight percent. The upper electrodes 8 are preferably made of Al and have a thickness of about 1000 nm. The bump electrodes 9 are preferably made of Au. The intermediate electrodes 7 are preferably formed by vacuum deposition and the upper electrodes 8 are preferably formed by vacuum deposition or sputtering. In order to form the bump electrodes 9, a ball formed on the end of an Au wire is press-bonded on each upper electrode 8 and then the ball is cut out from the Au wire.

Although FIG. 2 does not show the input electrode 2 and the other grounding electrode 4, they have the intermediate electrodes 7, the upper electrodes 8, and the bump electrodes 9 as in the output electrode 3 and one grounding electrode 4.

Figure 3:
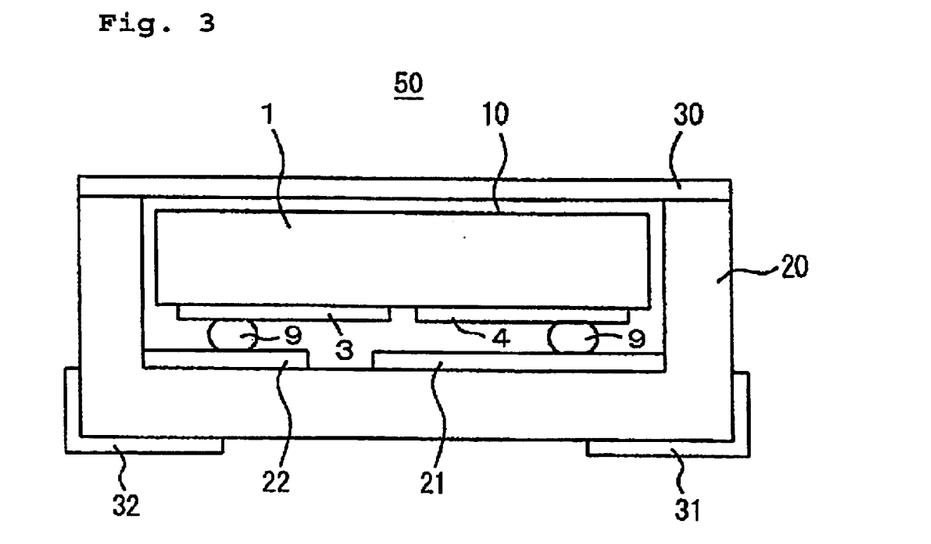
FIG. 3 is a sectional view of a surface acoustic wave device according to a preferred embodiment of the present invention.

Turning to FIG. 3, a surface acoustic wave device 50 according to another preferred embodiment of the present invention has the surface acoustic wave element 10, a packaging case 20, packaging electrodes 21 and 22, a cover 30, and external electrodes 31 and 32. The packaging case 20 is preferably formed of ceramic. The packaging electrodes 21 and 22 are patterned to be disposed in the packaging case 20. In order to mount the surface acoustic wave element 10, the bump electrodes 9 are connected to the packaging electrodes 21 and 22 such that the functional surface of the surface acoustic wave element 10, on which the interdigital transducer 5 is disposed, faces downward. A mounting technique for facing a functional surface downward is referred to as face-down mounting. By mounting the surface acoustic wave element 10 face-down, the output electrode 3 and the grounding electrode 4 are connected to the respective packaging electrodes 22 and 21 via the respective bump electrodes 9. The external electrodes 31 and 32 are connected to the packaging electrodes 21 and 22, respectively. The cover 30 is disposed to hermetically seal the surface acoustic wave element 10.

Although FIG. 3 does not show the input electrode 2 and the other grounding electrode 4, they are each connected to a packaging electrode via a bump electrode 9.

Figure 4:
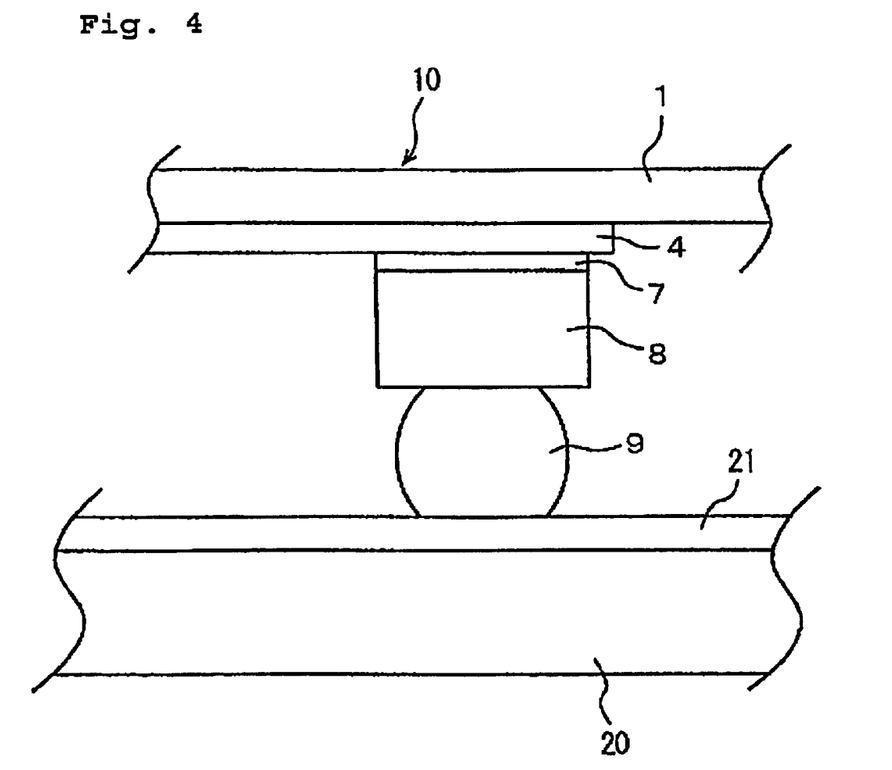
FIG. 4 is a fragmentary enlarged sectional view of a bump electrode in FIG. 3.

FIG. 4 illustrates the connection between the surface acoustic wave element 10 and the packaging electrode 21 using the bump electrodes 9. The bump electrode 9 in FIG. 4 is connected to the packaging electrode 21 such that the surface acoustic wave element 10 faces downward. While being subjected to an ultrasonic wave or heat, the bump electrode 9 is pressed to connect the grounding electrode 4 to the packaging electrode 21.

Figure 5A:
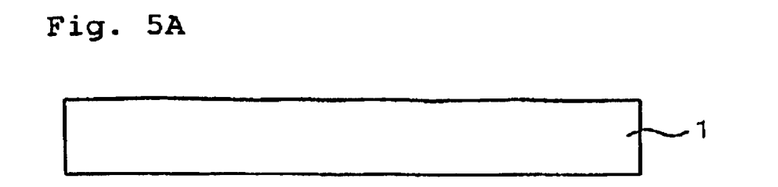
FIGS. 5A to 5F are process views showing a method for manufacturing the surface acoustic wave element and the surface acoustic wave device in FIG. 3
Figure 5B:
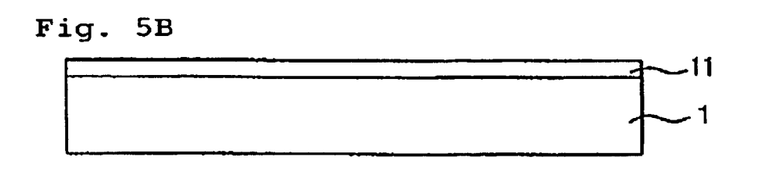
Figure 5C:
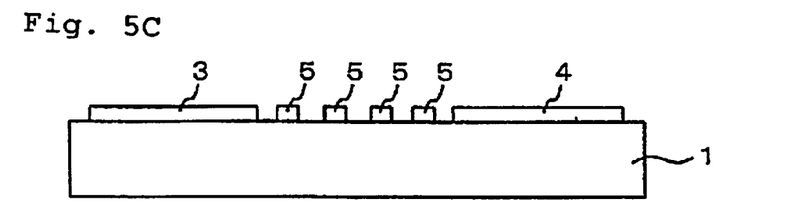

A method for manufacturing the surface acoustic wave element 10 and the surface acoustic wave device 50 will now be described with reference to FIGS. 5A to 6D. A lithium tantalate piezoelectric substrate 1 is cleaned in FIG. 5A. A metallic layer 11 mainly containing Al is formed on a main surface of the piezoelectric substrate 1 to a thickness of about 300 nm, as shown in FIG. 5B. The metallic layer 11 is patterned by photolithography or etching to form the input electrode 2, the output electrode 3, the grounding electrodes 4, the interdigital transducer 5, and the reflector electrodes 6, as shown in FIG. 5C. FIG. 5C here does not show the input electrode 2 and the other grounding electrode 4.

Figure 5D:
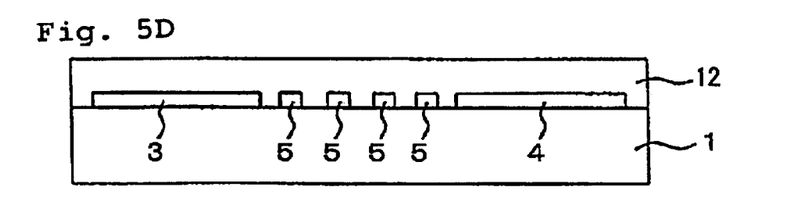
Figure 5E:
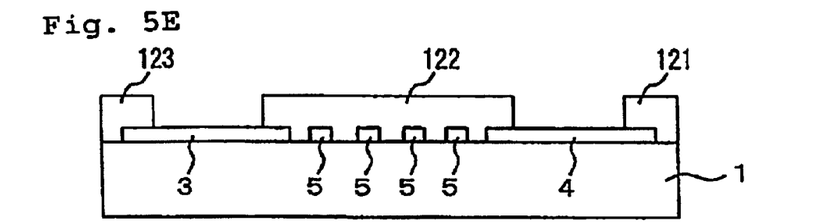

Then, a resist 12 is applied by spin coating to cover the input electrode 2, the output electrode 3, the grounding electrodes 4, the interdigital transducer 5, and the reflector electrodes 6, and subsequently, the resist 12 is subjected to pre-baking to be dried, as shown in FIG. 5D. The resist 12 is patterned to form resist patterns 121 to 123 by photolithography or etching such that the intermediate electrodes 7 and the upper electrodes 8 are formed on a portion of the input electrode 2, the output electrode 3, and the grounding electrodes 4, as shown in FIG. 5E.

Figure 5F:
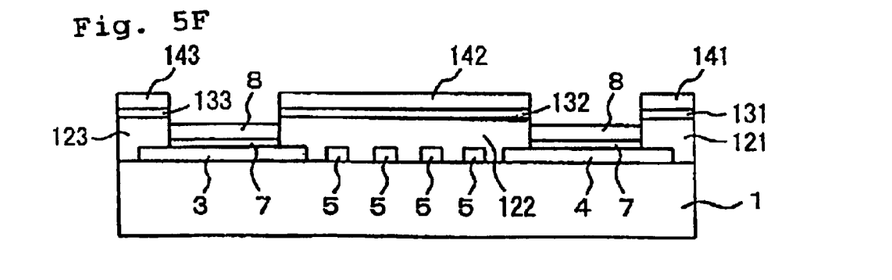

Using the resist patterns 121 to 123 as masks, NiCr containing about 25 weight percent of Cr is deposited in a vacuum to form the intermediate electrodes 7 having a thickness of about 200 nm, and Al is successively deposited on the intermediate electrodes 7 to form the upper electrodes 8 having a thickness of about 1000 nm, as shown in FIG. 5F. Specifically, Ni, Cr, Al are separately contained in each crucible. Crucibles containing Ni and Cr are heated so that the Ni and the Cr are deposited. Then, another crucible containing Al is heated so that the Al is deposited on the NiCr intermediate electrodes 7. The Cr crucible contains about 25% of Cr relative to the total weight of the Ni and the Cr, so that the Cr content in the NiCr intermediate electrodes 7 is about 25 weight percent. Thus, NiCr layers 131 to 133 and Al layers 141 to 143 are deposited on the resist patterns 121 to 123, respectively.

Figure 6A:
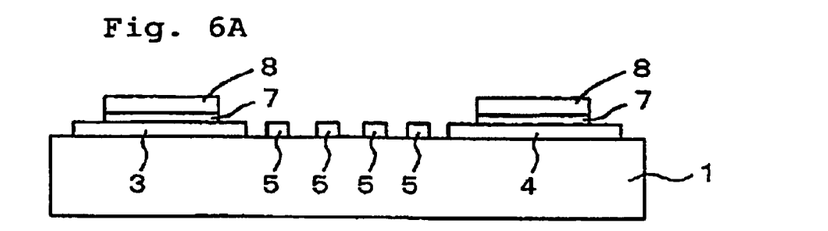
FIGS. 6A to 6D are process views showing a method for manufacturing the surface acoustic wave element and the surface acoustic wave device in FIG. 3

Turning to FIGS. 6A to 6D, after the deposition, the resist patterns 121 to 123 are removed to complete the intermediate electrodes 7 and the upper electrodes 8 so as to overlie a portion of the input electrode 2, the output electrode 3, and the grounding electrodes 4, as shown in FIG. 6A. A technique such that the intermediate electrodes 7 and successively the upper electrodes 8 are deposited using the resist patterns 121 to 123, which are supposed to be removed, to be formed on the input electrode 2, the output electrode 3, and the grounding electrodes 4 at the same time is referred to as lift off.

Figure 6B:
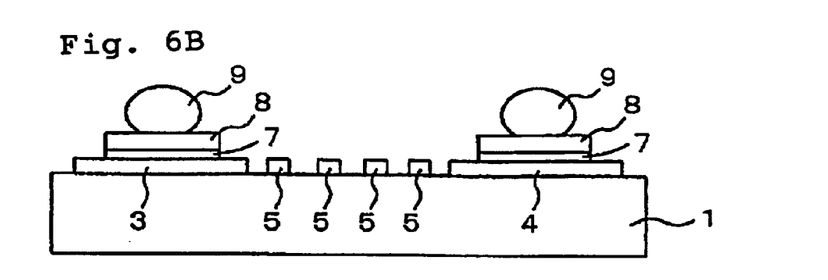

Next, balls formed on ends of Au wires are press-bonded on the upper electrodes 8 with an ultrasonic wave applied to the balls. Then, the balls are cut out from the wires to form the bump electrodes 9, as shown in FIG. 6B. Thus, the surface acoustic wave element 10 is completed.

Figure 6C:
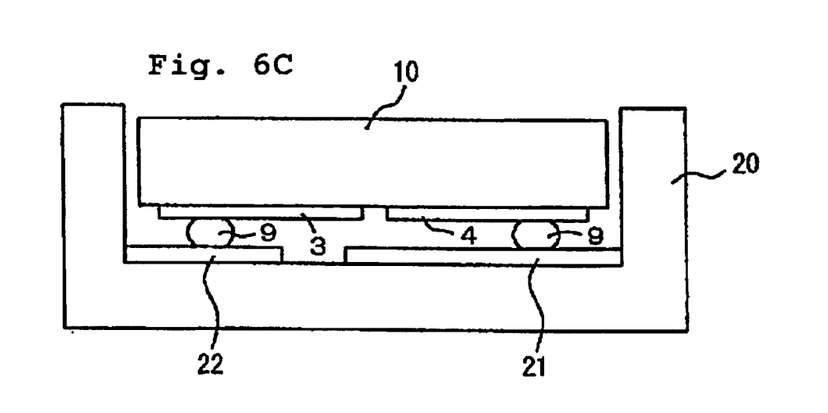
Figure 6D:
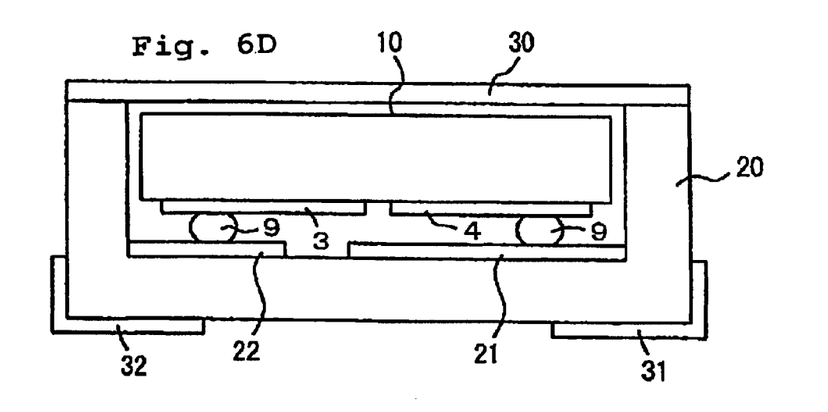

Then, with the functional surface of the surface acoustic wave element 10 facing downward, the bump electrodes 9 are pressed so that the electrode pads, such as the output electrode 3 and the grounding electrodes 4, are connected to the packaging electrodes 21 and 22, as shown in FIG. 6C. The cover 30 is disposed to hermetically seal the surface acoustic wave element 10, and finally, the external electrodes 31 and 32 are formed. Thus, the surface acoustic wave device 50 is completed, as shown in FIG. 6D.

In the above description, the NiCr intermediate electrodes 7 are preferably deposited in a vacuum using two crucibles, which contain Ni and Cr separately. However, the intermediate electrodes 7 may be formed using a single crucible containing a NiCr alloy ingot.

In this instance, the Cr content in the ingot is different from the Cr content in the resulting NiCr layer. This is because the vapor pressures of Ni and Cr differ depending on the temperature of the crucible of the NiCr ingot, the distance between the ingot and the wafer (the piezoelectric substrate 1), and the deposition rate.

Figure 7:
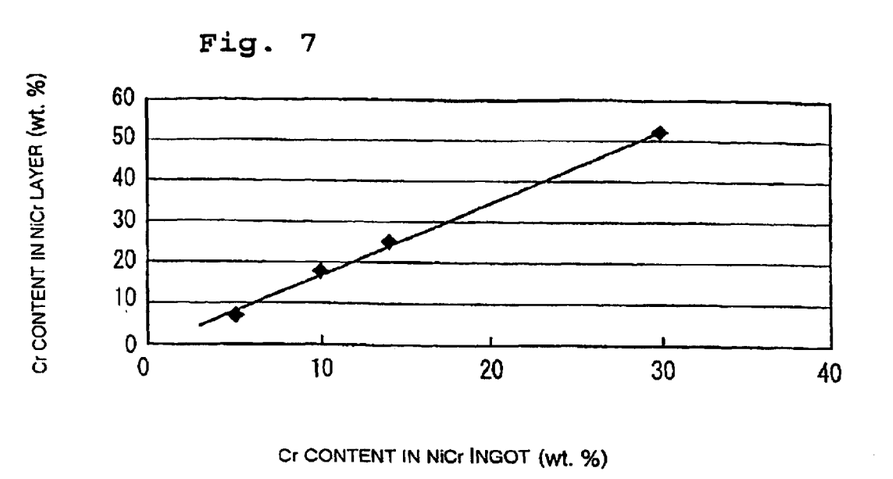
FIG. 7 is a graph showing the relationship between the Cr content in a NiCr layer and the Cr content in a NiCr ingot.

FIG. 7 shows the relationship between the Cr content in a NiCr ingot and the Cr content in the resulting NiCr layer deposited in a vacuum using a single crucible containing the NiCr ingot. The vertical axis represents the Cr content (weight percent) in the NiCr layer and the horizontal axis represents the Cr content (weight percent) in the NiCr ingot. The Cr content in the NiCr layer increases in proportion to the Cr content in the NiCr ingot. However, the Cr content in the NiCr layer is different from the Cr content in the NiCr ingot. For example, a NiCr ingot containing about 20 weight percent of Cr results in a NiCr layer containing about 34 weight percent of Cr by vacuum deposition. When a NiCr layer is formed by vacuum deposition using a NiCr ingot, by changing the Cr content in the NiCr ingot in the range of about 3 to about 30 weight percent, the Cr content in the NiCr layer can be about 5 to about 50 weight percent.

FIG. 7 suggests that the Cr contents in the NiCr ingot and the NiCr layer satisfy the following relational expression.

$$y = 1.7117x + 0.1276 \quad (1)$$

x represents the Cr content in the NiCr ingot, and y represents the Cr content in the NiCr layer.

Preferably, the intermediate electrodes 7 are formed by vacuum deposition in which the Cr contents in the NiCr layer and the NiCr ingot satisfy the relational expression (1).

If the NiCr ingot is used to form the intermediate electrodes 7, the step shown in FIG. 5F is performed in accordance with the following process. After the resist 12 is subjected to photolithography or etching to form the resist patterns 121 to 123 acting as masks, as shown in FIG. 5D, a NiCr layer containing about 25 weight percent of Cr is deposited using a NiCr ingot containing about 7.2 weight percent of Cr to form the intermediate electrodes 7 having a thickness of about 200 nm. Then, the Al upper electrodes 8 are successively deposited on the intermediate electrodes 7 to a thickness of about 1000 nm. The other steps are the same as described above.

The inventors investigated whether Al is deposited on the interdigital transducer 5 of surface acoustic wave elements formed according to the above-described method, in which the Cr content in the NiCr intermediate electrodes 7 is changed in the range of about 5 to about 50 weight percent. Also, the inventors conducted a drop test on surface acoustic wave devices having the surface acoustic wave element mounted in the packaging case to determine the peeling rate of the surface acoustic wave element from the packaging case. In this instance, by changing the ratio of the Cr weight to the Ni weight, or by changing the Cr content in the NiCr ingot, the Cr content in the NiCr intermediate electrodes 7 is within the range of about 5 to about 50 weight percent. Table 1 shows the results. The drop test was conducted from a height of about 1 m to about 1.5 m.

content in the range of about 5 to about 35 weight percent did not have Al deposited on the interdigital transducer 5. In contrast, with respect to surface acoustic wave elements having the intermediate electrodes 7 containing about 40 weight percent of Cr, approximately 1.30% of the surface acoustic wave elements experienced the deposition of Al on the interdigital transducer 5. With respect to surface acoustic wave elements having the intermediate electrodes 7 containing about 45 weight percent of Cr, approximately 16.3% of the surface acoustic wave elements experienced the deposition of Al on the interdigital transducer 5, and with respect to surface acoustic wave elements having the intermediate electrodes 7 containing about 50 weight percent of Cr, approximately 56.3% of the surface acoustic wave elements experienced the Al deposition.

It is considered that, since a Cr content in the range of about 5 to about 35 weight percent results in an intermediate electrode 7 having a tensile stress of NiCr that is lower than a predetermined value, the resist patterns 121 to 123, acting as masks, do not recurve and that, therefore, the deposition of Al on the interdigital transducer 5 is not exhibited.

As described above, by setting the Cr content in the NiCr intermediate electrodes 7, which are disposed between the electrodes pads and the upper electrodes 8, in the range of

TABLE 1

| Cr content (wt %) | 5 | 10 | 15 | 20 | 25 | 30 | 35 | 40 | 45 | 50 |
|---|---|---|---|---|---|---|---|---|---|---|
| Drop test NG occurrence (%) | 31.5 | 5.26 | none | none | none | none | none | none | none | none |
| Failed Resist occurrence (%) | none | none | none | none | none | none | none | 1.30 | 16.3 | 56.3 |

With respect to the surface acoustic wave element having the NiCr intermediate electrodes 7 containing about 5 weight percent of Cr, approximately 31.5% of the surface acoustic wave elements were peeled from the packaging case. With respect to the surface acoustic wave elements having the NiCr intermediate electrodes 7 containing about 10 weight percent of Cr, approximately 5.26% of the surface acoustic wave elements were peeled from the packaging case. Surface acoustic wave elements having the intermediate electrodes 7 containing at least about 15 weight percent of Cr did not exhibit any peeling from the packaging case. It has been shown that the occurrence of the peeling of the surface acoustic wave element from the packaging case depends on the Cr content in the NiCr intermediate electrodes 7 and that a Cr content of at least about 15 weight percent does not cause the surface acoustic wave element to peel from the packaging case.

The inventors consider this occurs because, as the Cr content in the intermediate electrodes 7 increases, the adhesion between the NiCr intermediate electrodes 7 and the Al upper electrodes 8 and electrode pads, such as the input electrode 2, is greatly improved.

On the other hand, in the investigation of the deposition of Al on the interdigital transducer 5, surface acoustic wave elements having the intermediate electrodes 7 with a Cr about 15 to about 35 weight percent, the deposition of Al on the interdigital transducer 5 is prevented. Also, the surface acoustic wave element can be prevented from peeling from the packaging case during a drop test.

As described above, in order to prevent the deposition of Al on the interdigital transducer 5 and to prevent the surface acoustic wave element from peeling from the packaging case, the Cr content in the intermediate electrodes 7 is preferably within the range of about 15 to about 35 weight percent, and preferably in the range of about 15 to about 30 weight percent. In order to set the Cr content in the NiCr layer in the range of about 15 to about 30 weight percent, a NiCr ingot containing about 8 to about 18 weight percent of Cr is preferably used.

In the surface acoustic wave element and the surface acoustic wave device including the surface acoustic wave element according to various preferred embodiments of the present invention, the Cr content in the NiCr intermediate electrodes 7 is preferably within the range of about 15 to about 30 weight percent.

In order to ensure no occurrence of failure in the surface acoustic wave element and the surface acoustic wave device, preferably, the Cr content in the NiCr intermediate electrodes 7 is within the range of about 18 to about 28 weight percent. In order to set the Cr content in the NiCr layer in this range, a NiCr ingot containing about 10 to about 17 weight percent of Cr is used.

Using NiCr containing about 15 to about 30 weight percent of Cr for the intermediate electrodes 7 means that the intermediate electrodes 7 have enhanced adhesion to the electrode pads and the upper electrodes 8 and a tensile stress lower than a predetermined value. In other words, NiCr containing at least about 15 weight percent or more of Cr results in a metallic layer in which the adhesion strength thereof to the Al electrode pads and upper electrodes is more than about $10^7$ Pa. Also, NiCr containing about 30 weight percent or less of Cr results in a metallic layer having a tensile stress that is less than approximately $10^6$ Pa. In preferred embodiments of the present invention, the material of the intermediate electrodes 7 is not limited to NiCr containing about 15 to about 30 weight percent of Cr and any metal can be used as long as it has a tensile stress that is lower than a predetermined value and an adhesion strength to the electrode pads and the upper electrodes that is greater than a predetermined value.

In the description with reference to FIGS. 5A to 6D, the NiCr intermediate electrodes 7 are formed by vacuum deposition, but they may be deposited by sputtering. In other words, a NiCr layer may be deposited by sputtering to form the intermediate electrodes 7 as long as the Cr content in the NiCr layer is in the range of about 15 to about 30 weight percent and preferably in the range of about 18 to about 28 weight percent. In this instance, a Ni target and a Cr target are set in a chamber and RF powers are supplied to the Ni and Cr targets separately. Ar is preferably used as a sputtering gas. The Cr content in the NiCr layer is preferably in the range of about 5 to about 50 weight percent by varying the RF powers. Specifically, when the Cr content is increased, the RF power supplied to the Cr target is preferably larger, and when the Cr content is reduced, the RF power supplied to the Cr target is preferably smaller.

In preferred embodiments of the present invention, the piezoelectric substrate 1 is preferably made of lithium tantalate, but the piezoelectric substrate 1 may be made of any one of an insulating substrate having a lithium niobate layer or a zinc oxide layer, a quartz crystal, and langasite, or other suitable materials.

In preferred embodiments of the present invention, the input electrode 2, the output electrode 3, the grounding electrodes 4, the interdigital transducer 5, the reflector electrodes 6, and the upper electrodes 8 are preferably made of Al, but the material of these electrodes is not limited to Al. The input electrode 2, the output electrode 3, the grounding electrodes 4, the interdigital transducer 5, the reflector electrodes 6, and the upper electrodes 8 may be made of Au or an AlCu alloy including about 5% of Cu.

Also, the bump electrodes 9 are preferably formed of Au in preferred embodiments, but they are not limited to being formed of Au. The bump electrodes 9 may be solder bumps formed by plating or vapor deposition.

Although the present invention has been described herein using the preferred embodiments, it will be readily appreciated that various modifications may be made. The scope of the present invention is not defined by the preferred embodiments described above but by the appended claims, and the claims include modifications without departing from the scope and sprit of the invention.

What is claimed is:

1. A surface acoustic wave element comprising:

a piezoelectric substrate;

an interdigital transducer disposed on a main surface of the piezoelectric substrate;

an electrode pad disposed on the main surface of the piezoelectric substrate;

an intermediate electrode disposed on the electrode pad;

an upper electrode disposed on the intermediate electrode; and a bump electrode disposed on the upper electrode; wherein the intermediate electrode is a metal layer having a tensile stress that is lower than approximately $10^6$ Pa and an adhesion strength to one of the electrode pad and the upper electrode that is higher than approximately $10^7$ Pa.

2. A surface acoustic wave element according to claim 1, wherein the intermediate electrode includes NiCr containing about 15 to about 30 weight percent of Cr.

3. A surface acoustic wave element according to claim 1, wherein the intermediate electrode includes NiCr containing about 18 to about 28 weight percent of Cr.

4. A surface acoustic wave element according to claim 2, wherein the NiCr is deposited by evaporation.

5. A surface acoustic wave element according to claim 1, wherein the upper electrode includes one of Al and an alloy containing Al.

6. A surface acoustic wave device comprising:

a packaging case comprising a packaging electrode;

a cover for hermetically sealing the packaging case; and a surface acoustic wave element including:

a piezoelectric substrate;

an interdigital transducer disposed on a main surface of the piezoelectric substrate;

an electrode pad disposed on the main surface of the piezoelectric substrate;

an intermediate electrode disposed on the electrode pad;

an upper electrode disposed on the intermediate electrode; and a bump electrode disposed on the upper electrode and connected to the packaging electrode; wherein the intermediate electrode is a metal layer having a tensile stress that is lower than approximately $10^6$ Pa and an adhesion strength to one of the electrode pad and the upper electrode that is higher than approximately $10^7$ Pa.

7. A surface acoustic wave device according to claim 6, wherein the intermediate electrode includes NiCr containing about 15 to about 30 weight percent of Cr.

8. A surface acoustic wave device according to claim 6, wherein the intermediate electrode includes NiCr containing about 18 to about 28 weight percent of Cr.

9. A surface acoustic wave device according to claim 7, wherein the NiCr is deposited by evaporation.

10. A surface acoustic wave device according to claim 6, wherein the upper electrode includes at least one of Al and an alloy containing Al.

* * * * *